United States Patent

Renz et al.

[11] Patent Number: 6,020,740
[45] Date of Patent: Feb. 1, 2000

[54] ANTENNA ARRANGEMENT FOR A DIAGNOSTIC MAGNETIC RESONANCE APPARATUS

[75] Inventors: Wolfgang Renz; Bernd Stoeckel, both of Erlangen, Germany

[73] Assignee: Siemens Aktiengesellschaft, Munich, Germany

[21] Appl. No.: 08/941,052

[22] Filed: Sep. 30, 1997

[30] Foreign Application Priority Data

Sep. 30, 1996 [DE] Germany .............................. 196 40 359

[51] Int. Cl.⁷ .................................................. G01V 3/00
[52] U.S. Cl. .......................................... 324/318; 324/322
[58] Field of Search ..................................... 324/322, 318

[56] References Cited

U.S. PATENT DOCUMENTS

| | | | |
|---|---|---|---|
| 4,714,887 | 12/1987 | Meissner et al. | 324/322 |
| 5,396,174 | 3/1995 | Hanke et al. | 324/318 |
| 5,410,251 | 4/1995 | Renz | 324/318 |

FOREIGN PATENT DOCUMENTS

| | | |
|---|---|---|
| 43 14 338 A1 | 3/1994 | Germany . |
| 43 01 557 C2 | 7/1994 | Germany . |

*Primary Examiner*—Christine K. Oda
*Assistant Examiner*—Tiffany A. Fetzner
*Attorney, Agent, or Firm*—Hill & Simpson

[57] ABSTRACT

An antenna arrangement having at least a first and a second conductor section (2, 2a, 8) that are connected to one another via a capacitor arrangement (6, 6a, 6b). During operation, the first conductor section (2, 2a) exhibit an alternating first potential and the second conductor section (8) exhibits an alternating second, opposite potential with respect to a reference potential. A shielding against electrical fields is arranged between the antenna conductor arrangement and the imaging volume (12). The shielding (16) has no electrical connection to the reference potential. The shielding (16) has a first overlap region (18) with the first conductor section (2, 2a) and has a second overlap region (20) with the second conductor section (8). The relationship of the two overlap regions (18, 20) to one another is selected such that the potential of the shielding (16) assumes reference potential during operation.

5 Claims, 2 Drawing Sheets

ANTENNA ARRANGEMENT FOR A DIAGNOSTIC MAGNETIC RESONANCE APPARATUS

BACKGROUND OF THE INVENTION

The present invention is directed to an antenna arrangement for a diagnostic magnetic resonance apparatus for exciting and/or receiving magnetic resonance signals in or, respectively, from an imaging volume. An antenna conductor arrangement has at least first and second conductor sections. The conductor sections being connected to one another via a capacitor arrangement. During operation, the first conductor section exhibits an alternating first potential and the second conductor section exhibits an alternating, opposite, second potential relative to a reference potential. A shielding against electrical fields is arranged between the antenna conductor arrangement and the imaging volume.

In medicine, diagnostic magnetic resonance apparatus are employed, for producing tomograms of a patient or of a part of the patient. Different magnetic interactions of the different biological tissue are thereby interpreted, whereby the tissue is located in the imaging volume of the magnetic resonance apparatus. In the transmission case, an antenna arrangement generates high-frequency, spatially expansive magnetic fields. In the reception case, the same antenna arrangement or a special antenna arrangement receives the magnetic resonance signals emitted by the excited nuclei. The electrical fields that are always present with the high-frequency magnetic fields, however, are undesirable. In the reception case, the coupling of the electrical fields to the tissue under examination in the imaging volume leads to additional noise. In the transmission case, it leads to additional tissue heating and to a load-dependent detuning of the antenna arrangement.

German Published Application DE 43 14 338 A1 (corresponding to U.S. Pat. No. 5,410,251) discloses an antenna arrangement of the type initially cited wherein an electrical shielding is provided, which shields the electrical field generated by the antenna arrangement in the transmission case from the tissue and, conversely, electrically shields the antenna arrangement from the tissue in the reception case. The electrical shielding is implemented as a Faraday shield that is connected to a reference potential and is arranged between the antenna conductor and the imaging volume. Since the patient or the part of the patient to be examined in the imaging volume also assumes reference potential during operation of the magnetic resonance apparatus, electrical fields between the shielding and the patient are largely reduced. The expansive shielding of the antenna conductor by the Faraday shield, however, can also deteriorate the magnetic field. Further, the structural outlay is high because of the electrical leads to the reference potential that are required.

German Patent DE 43 01 557 C2, (Corresponding to U.S. Pat. No. 5,396,174 issued to Hanke et al.), discloses a Faraday shielding for a high-frequency antenna of a magnetic resonance apparatus that has little influence on the magnetic field component of the high-frequency field. This is achieved with a comb-like structuring of the Faraday shield.

SUMMARY OF THE INVENTION

It is an object of the present invention to provide a shielding for a diagnostic magnetic resonance apparatus that, first, has little negative influence on the distortion of the high-frequency magnetic field and, second, requires only slight structural outlay.

This object is achieved because the shielding has no electrical connection to the reference potential. The shielding has a first overlap region with the first conductor section and has a second overlap region with the second conductor section. A relationship of the two overlap regions to one another is selected such that the potential of the shielding assumes the reference potential during operation. What is thereby exploited is that the location of the highest electrical field location of the greatest coupling of the tissue with the electrical field the lies in the environment of the capacitors inserted into the antenna conductor. The shielding divides the originally existing discontinuity in potential, in the region of the capacitor, into a plurality of discontinuities in potential, in the region of the antenna conductors at the end of the shielding. Differing from the non-shielded condition, the maximally existing, local, dissipated power density is distributed onto a plurality of locations and correspondingly reduced. The differences in potential, between the non-shielded antenna conductor and the tissue, that unavoidably continue to exist, have only a slight influence on the behavior of the antenna arrangement.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
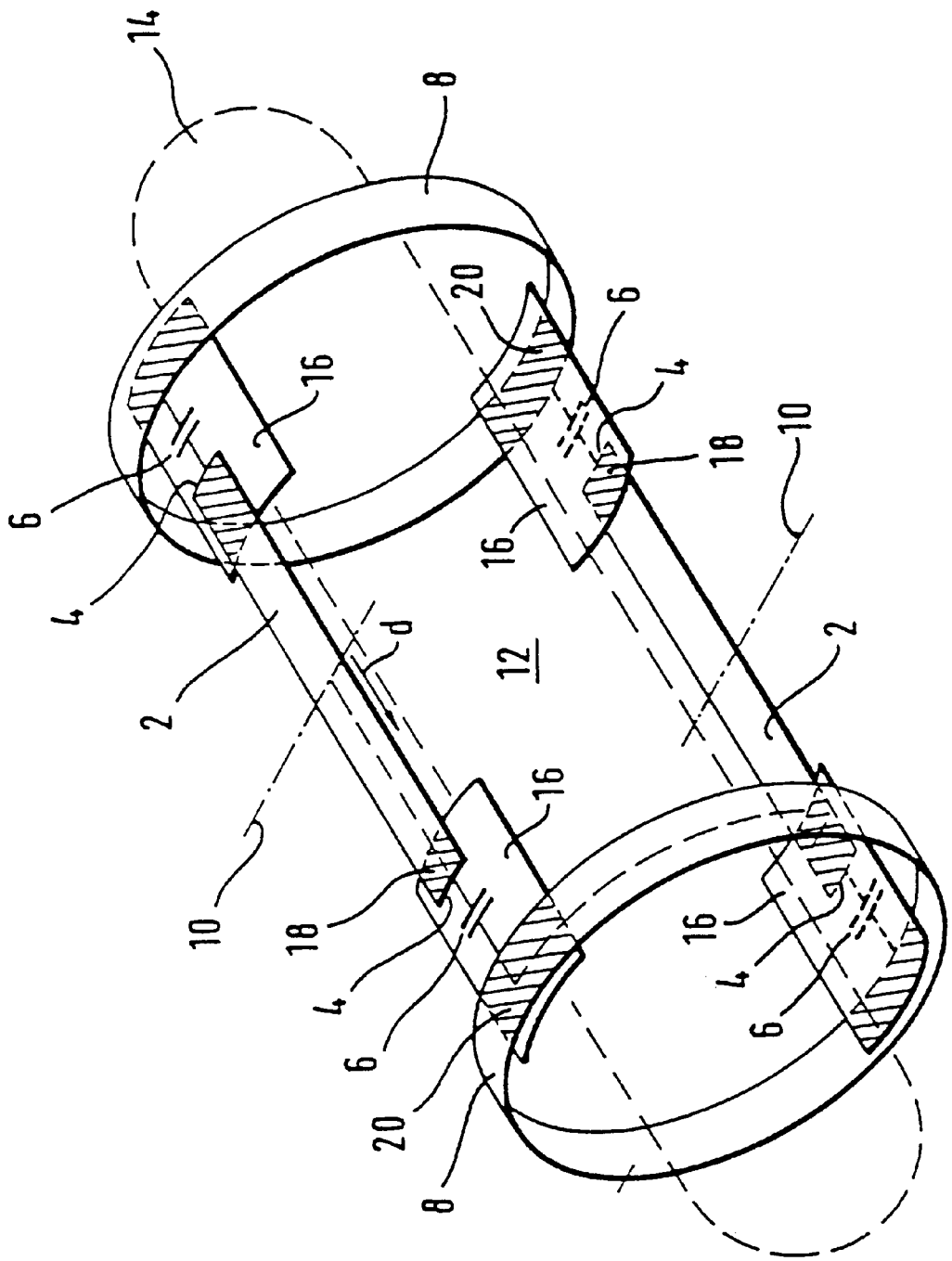
FIG. 1 is a perspective view of an antenna arrangement with an electrical shielding.

The antenna arrangement shown in FIG. 1 is constructed as an end ring resonator. It is dimensioned as a whole-body antenna, so that its cylindrical interior can accept a patient. Two longitudinal conductors 2 are arranged opposite one another in longitudinal direction or axial direction on a generated surface of a cylinder. The opposite ends 4 of each longitudinal conductor 2 or first conductor section are connected to a respective end ring 8 or second conductor section via a respective resonance capacitor 6. The two end rings 8 are arranged in circumferential direction on the cylinder in the immediate proximity of the ends 4. The longitudinal conductors 2 and the end rings 8 are composed, for example, of copper band that is arranged on an insulating carrier. The resonance capacitors 6 are dimensioned such that, during operation, a standing current wave whose maximum lies in the middle 10 of the longitudinal conductors 2 forms on the longitudinal conductors 2. Given an anti-phase feed of the longitudinal conductors 2 lying opposite one another, a high-frequency magnetic field that is aligned transversely relative to the longitudinal cylinder axis is generated in the interior of the antenna conductor arrangement or in the imaging volume 12. In the reception case, analogously, the principal sensitivity direction of the antenna arrangement likewise lies transversely to the cylinder axis. A patient to be examined or a part of a patient to be examined is schematically indicated by a broken line 14.

The strong electrical fields occurring in the environment of the resonance capacitors 6 are respectively kept away from the patient or from the tissue 14 to be examined by a shielding 16 (E-field shielding). In the reception case, the shielding 16 likewise shields the region of maximum sensitivity of the antenna arrangement for electrical fields from the tissue 14 to be examined. The shieldings 16 are arranged insulated from the longitudinal conductor 2 and end ring 8 and have a first overlap region 18 with the first conductor section 2, 4 and a second overlap region 20 with the second conductor section 8. The shieldings 16 have no connections to a reference potential. The required reference potential of the shielding is defined exclusively by the potential of the longitudinal conductor 2 and of the end ring 8 occurring during operation as well as by the relationship of the first and second overlap region to one another, as to be described later.

Figure 2:
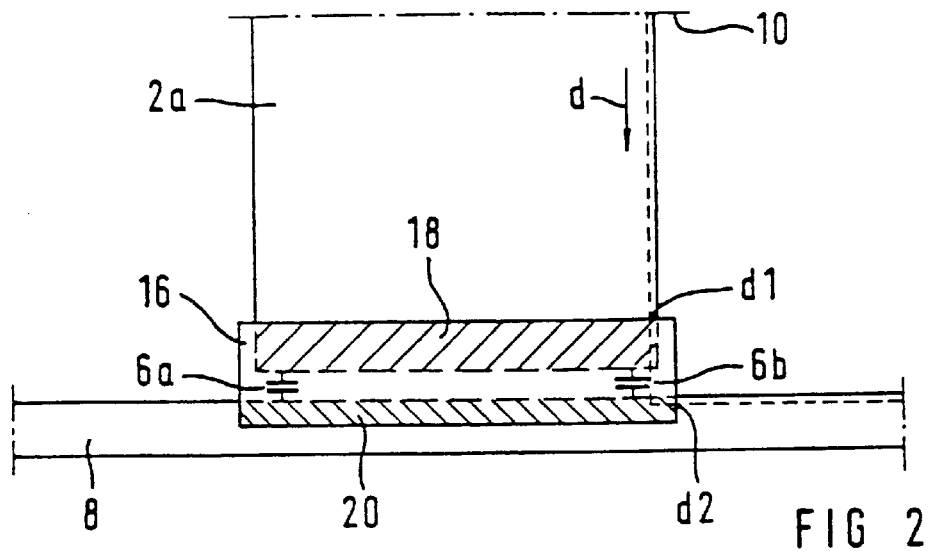
FIG. 2 is a plan view onto a shielding in a developed view.

FIG. 2 shows a part of the antenna arrangement with the inventive E-field shielding 16. Since the antenna arrangement is symmetrically constructed, the part shown in the development in FIG. 2 is representative for the entire antenna arrangement shown in FIG. 1. One half of an antenna conductor 2a implemented wider as a difference from FIG. 1 as well as a half of the end ring 8 connected thereto are shown. Here, too, the antenna conductors 2a and 8 are composed of a broad and thin metallic layer in the form of a band or of a band-shaped foil. Since the antenna currents in the antenna conductor 2a are principally concentrated on the edge region, the resonance capacitor 6 in the embodiment of FIG. 2 is divided into two resonance capacitors 6a and 6b arranged at the edge.

Figure 3:
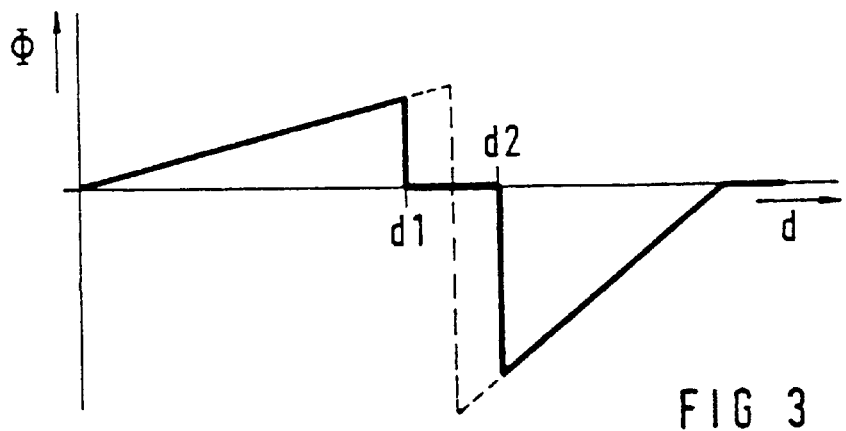
FIG. 3 depicts a characteristic curve of potential along a first and second antenna conductor section.

For explaining the effect of the shielding 16, FIG. 3 shows the curve of the electrical potential φ at a predetermined point in time that occurs at the longitudinal conductor 2 or, respectively, 2a and the end ring 8 along the path d. Over time, the potential changes with the operating frequency of the antenna arrangement according to a sine function. In the middle 10 of the longitudinal conductor 2a, the potential is initially zero or, respectively, assumes reference potential; the current on the longitudinal conductor 2a has its maximum there. Due to the constant inductivity per unit length on the longitudinal conductor 2, 2a, the potential increases linearly from the middle 10 of the longitudinal conductor 2a to the end 4. From the location d1, the longitudinal conductor 2a is electrically shielded from the neighboring tissue by the shielding 6. The shielding 16 acting in the region from d1 to d2 assumes the reference potential or the potential zero. From the location d2, the potential d2 jumps to a negative value in order to then again rise linearly up to the reference potential because of the constant inductivity per unit length of the end ring 8. Since the inductivity per unit length of the end conductor 8 is bigger than the inductivity coating of the longitudinal conductor 2a, the discontinuity in potential is higher at the location d2 than at the location d1. Furthermore, the rise in potential in the end ring 8 is steeper. The curve of potential without shielding 16 is entered with broken lines in FIG. 3. The main effect of the shielding 16, accordingly, is in dividing a large jump in potential into two smaller jumps in potential, as a result whereof locally existing dissipated power densities are greatly reduced.

Figure 4:
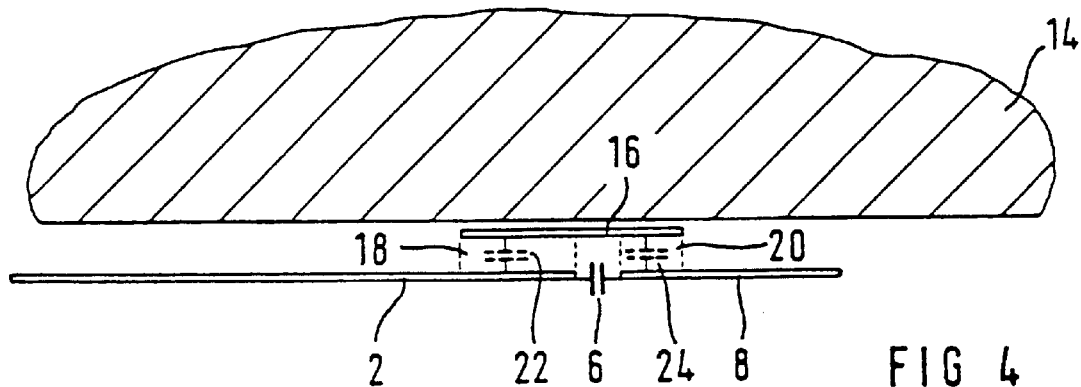
FIG. 4 is a side view of the shielding.

In a side view of the development, FIG. 4 shows the effect of the overlaps 18, 20 on the potential of the shielding 16. A first capacitor 22 is formed due to the overlapping arrangement of the shielding 16 with the longitudinal conductor 2, and a second capacitor 24 is formed due to the overlapping arrangement with the end ring 8. The two capacitors 22 and 24 are electrically connected in series and bridge the resonance capacitor 6. As a capacitive voltage divider, they determine the potential of the shielding 16. Compared to the capacitance value of the resonance capacitors 6, however, the capacitors 22 and 24 represent only small capacitances, so that the electrical behavior of the antenna is only insignificantly modified by the shielding 16. The relationship of the capacitances 22 and 24 is set such that the shielding assumes the reference potential during operation of the antenna arrangement. Given a constant spacing of the metallic surface of the shielding 16 from the longitudinal conductor 2 and from the end ring 8, this is achieved here exclusively on the basis of a corresponding dimensioning of the two overlaps 18, 20.

The shielding 16 is described here in its employment with a linearly polarized antenna arrangement. However, the shielding 16 without electrical connection to the reference potential can always be provided when neighboring conductor sections 4, 8 assume an opposite potential with respect to the reference potential during operation. Via a dimensioning of the overlaps, the fact that the potential of the shielding 16 assumes reference potential during operation can then always be achieved. Accordingly, with the shielding 16 the electrical behavior in circularly polarizing antennas and local antennas or in antenna arrays can also be improved.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An antenna arrangement for a diagnostic magnetic resonance apparatus for exciting magnetic resonance signals in an imaging volume; or, receiving magnetic resonance signals from an imaging volume, comprising:

an antenna conductor arrangement that has at least first and second conductor sections, said conductor sections being connected to one another via a capacitor arrangement, and, during operation, the first conductor section exhibiting an alternating first potential to a reference potential and the second conductor section exhibiting an alternating second potential relative to the reference potential, the second potential being opposite the first potential;

a shielding against electrical fields arranged between the antenna conductor arrangement and the imaging volume, the shielding having no electrical connection to the reference potential;

the shielding having a first overlap region with the first conductor section and having a second overlap region with the second conductor section; and a predetermined relationship of the two overlap regions to one another such that a potential of the shielding assumes the reference potential during operation of the diagnostic magnetic resonance apparatus.

2. The antenna arrangement according to claim 1, wherein the conductor sections have band-shaped configurations.

3. The antenna arrangement according to claim 1, wherein the shielding has a metallic surface that is arranged substantially at a constant spacing from each of the first and second conductor sections.

4. An antenna arrangement for a diagnostic magnetic resonance apparatus for exciting magnetic resonance signals in an imaging volume; and, receiving magnetic resonance signals from an imaging volume, comprising:

an antenna conductor arrangement that has at least first and second conductor sections, said conductor sections being connected to one another via a capacitor arrangement, and, during operation, the first conductor section exhibiting an alternating first potential to a reference potential and the second conductor section exhibiting an alternating second potential relative to the reference potential, the second potential being opposite the first potential;

each of the conductor sections being a broad, thin metallic layer having a band-shaped configuration;

a shielding against electrical fields arranged between the antenna conductor arrangement and the imaging volume, the shielding having no electrical connection to the reference potential;

the shielding having a first overlap region with the first conductor section and having a second overlap region with the second conductor section; and a predetermined relationship of the two overlap regions to one another such that a potential of the shielding assumes the reference potential during operation of the diagnostic magnetic resonance apparatus.

5. An antenna arrangement for a diagnostic magnetic resonance apparatus for exciting magnetic resonance signals in an imaging volume; and, receiving magnetic resonance signals from an imaging volume, comprising:

an antenna conductor arrangement that has at least first and second conductor sections, said conductor sections being connected to one another via a capacitor arrangement, and, during operation, the first conductor section exhibiting an alternating first potential to a reference potential and the second conductor section exhibiting an alternating second potential relative to the reference potential, the second potential being opposite the first potential;

a shielding against electrical fields arranged between the antenna conductor arrangement and the imaging volume, the shielding having no electrical connection to the reference potential, the shielding having a metallic surface that is arranged substantially at a constant spacing from the first and second conductor sections;

the shielding having a first overlap region with the first conductor section and having a second overlap region with the second conductor section; and a predetermined relationship of the two overlap regions to one another such that a potential of the shielding assumes the reference potential during operation of the diagnostic magnetic resonance apparatus.

* * * * *